(12) United States Patent
Ivanov et al.

(10) Patent No.: US 11,881,825 B2
(45) Date of Patent: Jan. 23, 2024

(54) TRIMMING OPERATIONAL AMPLIFIERS

(71) Applicant: Texas Instruments Incorporated, Dallas, TX (US)

(72) Inventors: Vadim Valerievich Ivanov, Tucson, AZ (US); Munaf Hussain Shaik, Tucson, AZ (US); Srinivas Kumar Pulijala, Tucson, AZ (US); Patrick Forster, Freising (DE); Jerry Lee Doorenbos, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 519 days.

(21) Appl. No.: 17/136,073

(22) Filed: Dec. 29, 2020

(65) Prior Publication Data

US 2022/0209730 A1 Jun. 30, 2022

(51) Int. Cl.
*H03F 3/45* (2006.01)
*H03M 1/66* (2006.01)
*H03M 1/38* (2006.01)

(52) U.S. Cl.
CPC .......... *H03F 3/45475* (2013.01); *H03M 1/38* (2013.01); *H03M 1/66* (2013.01); *H03F 2200/375* (2013.01)

(58) Field of Classification Search
CPC ...... H03F 1/02; H03F 3/45179; H03F 1/3247; H03F 3/187; H03F 1/303; H03F 3/005; H03F 3/2178; H03F 2200/23; H03F 2200/24; H03F 2200/37; H03F 2200/39; H03F 2200/41; H03F 2203/72; H03F 3/45475; H03F 3/04
USPC .............................................. 330/9, 253, 307
See application file for complete search history.

(56) References Cited

U.S. PATENT DOCUMENTS

| | | | | |
|---|---|---|---|---|
| 4,460,873 | A * | 7/1984 | Hester | H03F 3/45479 330/261 |
| 6,573,783 | B2 * | 6/2003 | Gray | H03F 3/45771 330/253 |
| 7,057,460 | B2 * | 6/2006 | Kaviani | H03F 3/45188 330/261 |
| 9,876,514 | B1 * | 1/2018 | Corman | G06F 3/061 |
| 10,033,331 | B1 | 7/2018 | Ivanov | |
| 10,855,383 | B2 * | 12/2020 | McMorrow | H04W 52/367 |
| 2016/0173037 | A1 * | 6/2016 | Puscasu | H03F 3/45179 330/260 |
| 2021/0350836 | A1 * | 11/2021 | Shih | G11C 7/067 |
| 2022/0101890 | A1 * | 3/2022 | Lin | G11C 29/026 |

* cited by examiner

*Primary Examiner* — Patricia T Nguyen
(74) *Attorney, Agent, or Firm* — John R. Pessetto; Frank D. Cimino

(57) ABSTRACT

Disclosed is a system that comprises an operational amplifier with adjustable operational parameters and a trimming module. The trimming module can adjust the operational parameters of the op-amp based on a memory value to compensate for an offset voltage of the op-amp. The trimming module can comprise successive approximation register (SAR) logic that controls the memory value. The SAR logic can be configured to detect a given memory value that causes an output voltage of the op-amp to be within a predetermined voltage interval when applying a predetermined common mode voltage to inverting and non-inverting inputs of the op-amp.

14 Claims, 5 Drawing Sheets

TABLE 1

|  | STANDARD | | OPTIMIZED | |
| --- | --- | --- | --- | --- |
|  | t [mS] | BIT WEIGHT | t [mS] | BIT WEIGHT |
| MV[0] | 20 | 8192 | 5 | 8192 |
| MV[1] | 40 | 4096 | 10 | 4096 |
| MV[2] | 60 | 2048 | 15 | 2048 |
| MV[3] | 80 | 1024 | 20 | 1024 |
| MV[4] | 100 | 512 | 25 | 512 |
| MV[5] | 120 | 256 | 30 | 256 |
| MV[6] | 140 | 128 | 50 | 1000 |
| MV[7] | 160 | 64 | 70 | 500 |
| MV[8] | 180 | 32 | 90 | 200 |
| MV[9] | 200 | 16 | 110 | 80 |
| MV[10] | 220 | 8 | 130 | 40 |
| MV[11] | 240 | 4 | 150 | 20 |
| MV[12] | 260 | 2 | 170 | 10 |
| MV[13] | 280 | 1 | 190 | 1 |

FIG. 7

TRIMMING OPERATIONAL AMPLIFIERS

TECHNICAL FIELD

The present disclosure relates to the trimming of amplifier devices. More particularly, the present disclosure relates to a system comprising an operational amplifier and a trimming module, and a method of trimming various devices, such as amplifiers, references, regulators and the like.

BACKGROUND

Operational amplifiers can be trimmed during or after manufacture to improve the precision and accuracy of the devices. Some of the main objectives for trimming techniques include the correction of offset, gain and temperature drift, among other parameters, in the devices. Modern trimming techniques for the initial production adjustment of offset, gain and other device parameters generally comprise some type of on-chip digital memory, for example in the form of EPROM or fuse links. During the trimming process, test circuitry can be used to measure the device parameters to make a determination as to how many and which bits of a memory value should be set, e.g. from a "zero" or "low" state to the opposite "one" or "high" state.

SUMMARY

A system comprising an operational amplifier integrated circuit chip is disclosed. The system also includes a trimming module for trimming the operational amplifier.

One example relates to a system comprising an integrated circuit (IC) chip with an operational amplifier (op-amp) having adjustable operational parameters. The IC chip can also include a trimming module. Alternatively, the trimming module can be separate from the IC. The trimming module can adjust the operational parameters of the op-amp based on a memory value to compensate for an offset voltage of the op-amp. The trimming module can also include a successive approximation register logic (SAR logic) that controls the memory value. The SAR logic can be configured to detect a given memory value that causes a parameter of the op-amp, such as an output voltage of the op-amp, to be within a predetermined (voltage) interval when a predetermined common mode voltage is applied to inverting and non-inverting inputs of the op-amp. The SAR logic can include conducting a first number of iterations for determining coarse bits of the memory value. The SAR logic can further include conducting a second number of iterations for determining remaining fine bits of the memory value. The first number of iterations can be conducted at a first clock cycle duration. The second number of iterations can be conducted at a second clock cycle duration. The second clock cycle duration can be different from the first clock cycle duration. The first clock cycle duration can be shorter than the second clock cycle duration.

Another example relates to a method that can include applying, in a trim mode of an integrated circuit comprising an operational amplifier (op-amp), a given common mode voltage to inverting and non-inverting inputs of the op-amp. The method can also include conducting, in a successive approximation register logic of a trimming module connected to the op-amp, a first number of iterations determining coarse bits of a memory value. The first number of iterations can be conducted at a first clock cycle duration. The method can further include conducting, in the SAR logic, a second number of iterations determining remaining fine bits of the memory value. The second number of iterations can be conducted at a second clock cycle duration. The second clock cycle duration can be different from the first clock cycle duration. The second clock cycle duration can be longer than the first clock cycle duration. The method can also include, after each iteration, adjusting a trim control signal that changes an operational parameter of the op-amp to trim it based on the memory value. After each iteration, the method can further include measuring, at the trimming module, a parameter based on the adjusting. After each iteration, the method can yet further include detecting, at the trimming module, whether the measured parameter of the op-amp is within a predetermined interval.

BRIEF DESCRIPTION OF THE DRAWINGS

FIG. 7 illustrates a table comparing a SAR logic with an adapted SAR logic.

DETAILED DESCRIPTION

An operational amplifier integrated circuit chip is disclosed. The IC chip can employ an integrated op-amp to measure an offset during trimming procedure after fabrication of the IC chip. The IC chip can include a trimming module.

During a trimming procedure, both inputs (an inverting input and a non-inverting input) of the op-amp are connected to a common voltage source at a predetermined voltage level where an offset is expected. The two inputs could also be connected to a specific predetermined voltage (does not always have to be a common-mode).

Upon detecting that the trimming procedure has started, an oscillator can generate a clock signal. The oscillator can provide the clock signal to a Successive Approximation Register logic (SAR logic) driven by an output of the op-amp output. During the trimming procedure, the op-amp operates as a comparator of its own offset voltage. Moreover, based on the op-amp output, the SAR logic can write one or more values to memory that control an offset voltage of the op-amp. In particular, the one or more values are employed to control switches that adjust internal operational parameters of the op-amp (e.g. internal current and/or internal resistance) during normal operation of the op-amp.

Figure 1:
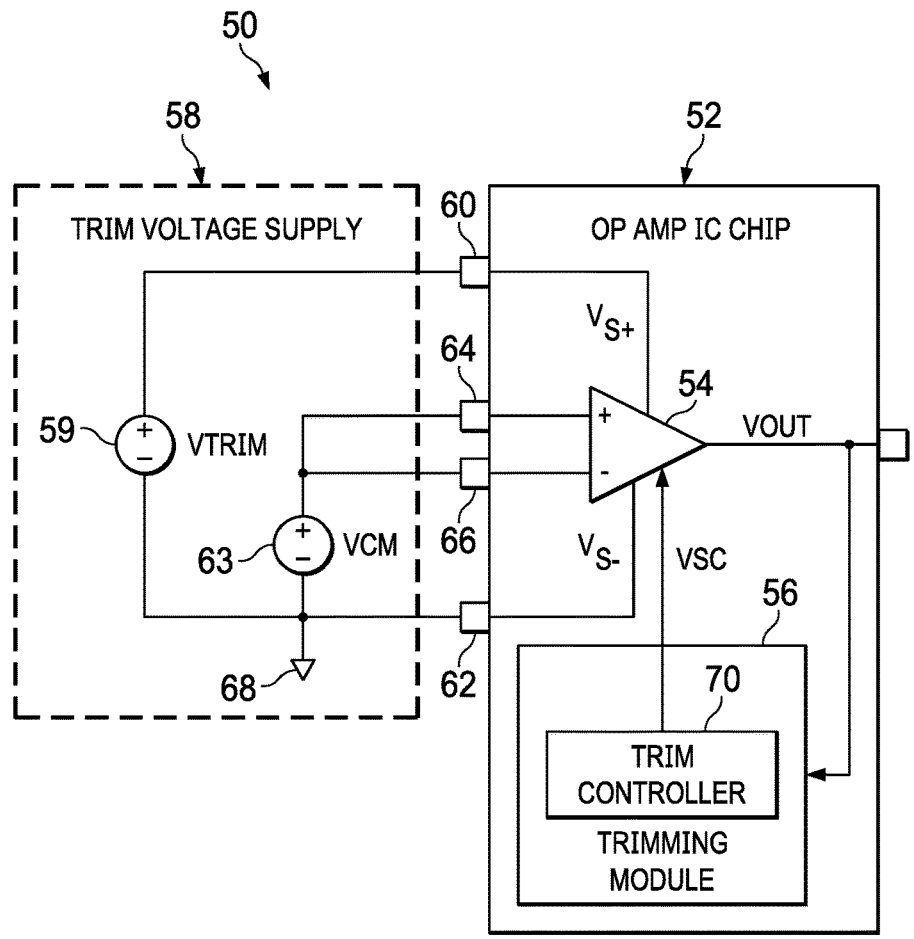
FIG. 1 illustrates a block diagram of a system for trimming an operational amplifier integrated circuit chip.

FIG. 1 illustrates a block diagram of a system 50 for trimming an integrated circuit chip 52 that includes an operational amplifier 54, such that the IC chip 52 can be referred to as an op-amp IC chip 52. Fabrication tolerances of the op-amp IC chip 52 allow for situations where the internal components (e.g. transistors and resistors) cause operational parameters of the op-amp 54 to operate at levels outside acceptable limits. Accordingly, the op-amp IC chip 52 can include an internal trimming module 56 that can measure a parameter under test, e.g. an output voltage VOUT, and generate a control voltage (trim control signal) VSC for the op-am 54 that causes the op-amp 54 to compensate for an undesired offset voltage VOS. This and other systems for trimming an integrated circuit are described in more detail in U.S. Pat. No. 10,033,331, which is hereby incorporated by reference in its entirety.

For purposes of simplification of explanation, the trimming module 56 is illustrated and described as being external to the op-amp 54. However, in some examples, the trimming module 56 can be representative of a module internal to the op-amp 54.

Upon fabrication of the op-amp IC chip 52, the op-amp IC chip 52 can be electrically coupled to a trim voltage supply 58. The trim voltage supply 58 can be, for example, test circuitry (e.g. automatic test equipment) configured to actuate a trimming procedure at the trimming module 56 of the op-amp IC chip 52. The trim voltage supply 58 can include a trimming voltage source 59 that applies a trimming voltage VTRIM that is coupled to a positive power supply VS+ via a lead (pin) 60 and a negative power supply VS− of the op-amp via a lead 62. Additionally, an inverting input lead 65 and a non-inverting input lead 66 can be shorted together in the trim voltage supply 58. Moreover, a common mode supply 63 can apply a common mode voltage VCM to both an inverting input lead 64 and a non-inverting input lead 66 of the op-amp 54.

The op-amp 54 can be configured to operate a nominal voltage VNOM. For example, a given common mode voltage VCM (e.g. a voltage at about 0.5 V less than the nominal voltage VNOM), can be set at the inverting and the non-inverting inputs of the op-amp 54 to actuate the trimming procedure. In such a situation, the trimming module 56 can detect the given common mode voltage, VCM, applied at both the inverting and non-inverting inputs of the op-amp 54 and initiate the trimming procedure in response the detection. In some examples, multiple trimming procedures can be executed. For instance, in some such examples, the positive supply voltage VS+ can be set for a given trimming procedure, and the common mode voltage, VCM, can be set for another trimming procedure.

Upon application of the trim voltage VTRIM by the trimming voltage source 59, the trimming module 56 can trigger a trimming procedure. In some examples, the trimming module 56 can measure the positive supply voltage VS+ of the op-amp 54. Accordingly, upon detecting the positive supply voltage VS+ being set to voltage at or near the trim voltage VTRIM, the trimming module can actuate the trimming procedure. In other examples, a code sequence can be applied to an input of the op-amp IC chip 52 to indicate that the trimming procedure has started.

In the trimming procedure, the trimming module 56 can cause a trim controller 70 to provide a trim signal VSC (e.g. a controlled voltage and/or current signal) of the trimming module 56 that adjusts (e.g. trims) operational parameters of the op-amp 54 which in turn adjusts the parameter under test, e.g. the output voltage VOUT of the op-amp 54. The trim controller 70 may comprise, for example, a digital-to-analog converter (DAC) that provides the trim signal VSC that adjusts a current provided by internal transistors of the op-amp 54, such that the trim controller 70 can be referred to as a current DAC. In additional examples, the trim controller 70 may be a DAC that provides the trim signal VSC to adjust a resistance of internal resistors of the op-amp 54, such that the trim controller 70 may be referred to as a resistor DAC. In further examples, the trim controller 70 may be configured to provide the trim signal VSC to adjust a size of a bank of internal transistor devices of the op-amp 54, such that the trim controller 70 may be referred to as a transistor adjustor. That is, multiple transistor devices can be coupled in parallel in a bank of internal transistor devices, and the trim signal VSC can be employed to control the number of transistor devices that are activated in the bank of internal transistor devices. Moreover, in some examples, the trim controller 70 can be configured as a combination of a current DAC, a resistor DAC and/or a transistor adjustor. In such a situation, multiple instances of the trimming module 56 and/or the trim controller 70 may be fabricated on the op-amp IC chip 52 to adjust different operational parameters of the op-amp 54.

The trimming module 56 can measure the parameter under test (e.g. the output voltage VOUT of the op-amp 54) to determine the trim signal VSC that results in a parameter under test that is within a predetermined interval, e.g. an output voltage VOUT that is within a predetermined voltage interval. For example, the predetermined voltage interval can be within +/−1 V, +/−0.5 V, +/−0.1 V, or any suitable other voltage interval. Differently speaking, the trimming module 56 can determine the trim signal VSC that results in an output voltage VOUT that is at or near 0 V (e.g. electrically neutral). The trimming module 56 can record data characterizing the trim control signal VSC with the output voltage at or near 0 V in a non-volatile memory. Moreover, the trimming module 56 can also disable further trimming procedures, such that the trimming procedure is executed once for the op-amp IC chip 52.

The op-amp IC chip 52 can be configured such that upon completion of the trimming procedure, the op-amp IC chip 52 can be decoupled (e.g. removed) from the trim voltage supply 58 and/or the trim module 56 and subsequently employed in another circuit. In such a situation, the trim controller 70 can provide the trim signal VSC that achieved an output voltage VOUT of about 0 V with a common mode voltage signal VCM at the offset voltage level VOS. In this manner, the op-amp 54 is considered to be "trimmed" and can operate as a precision op-amp.

By employment of the op-amp IC chip 52, no external measurements of operational parameters, such as input and/or output currents and/or voltages of the op-amp 54 are needed to trim the op-amp 54. Thus, the time and expense of measuring such operational parameters with external circuitry can be avoided. Furthermore, as explained herein, the components of the trimming module 56 are relatively small. Thus, the inclusion of the trimming module 56 does not significantly increase a die size (or cost) of the op-amp IC chip 52. The trim voltage supply 58 sets the trim voltage VTRIM at the trimming voltage source 59 and the common mode voltage VCM at the common mode supply 63 and waits a time sufficient (e.g. 2-30 milliseconds) to determine the trim control signal VSC. Thus, the trim voltage supply 58 can be implemented with relatively simple hardware and/or software.

Figure 2:
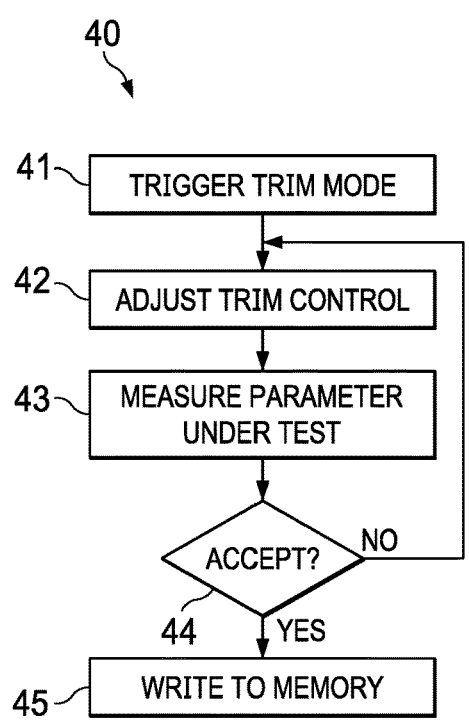
FIG. 2 illustrates a flow chart of a method of trimming an operational amplifier integrated circuit chip.

FIG. 2 illustrates a flowchart of an example method 40 for trimming an op-amp IC chip. The method 40 may be implemented, by the op-amp IC chip being trimmed, such as the op-amp IC chip 52 of FIG. 1. At 41, a trimming module (e.g. the trimming module 56 of FIG. 1) integrated or coupled with the op-amp IC chip can trigger operation of the op-amp IC chip in a trim mode. The triggering can be based, for example on detection of a high voltage (e.g. 7 V) signal at a supply voltage of an op-amp (e.g. the op-amp 54 of FIG. 1). Additionally or alternatively, the triggering can based on a detection of a predetermined common mode voltage being applied to an inverting input and a non-inverting input of the op-amp. In trim mode, an inverted and a non-inverting input of the op-amp can be coupled to a common mode voltage.

At 42, the trimming module can adjust a trim control signal VSC that adjusts a parameter under test, such as an output voltage VOUT of the op-amp IC chip. At 43, the parameter under test—e.g. the output voltage VOUT—can be measured by the trimming module. At 44, a determination can be made as to whether to accept the trim control signal VSC. The determination may be based, for example on the measured value. For instance, if the parameter under test (e.g. VOUT) is within a predetermined (voltage) interval (about 0 V), the determination at 44 can be positive (e.g. YES) and the method 40 can proceed to 45. Conversely, if the parameter under test (e.g. VOUT) is not within the predetermined interval (e.g. at a high voltage), the method 40 can return to 420.

In some examples, the SAR logic may cycle the memory and/or trim adjustment voltage through a series of value, levels or voltages until the offset voltage (detected at the output of the operational amplifier) falls below a threshold voltage (e.g. determined by a threshold voltage in a Schmidt trigger). When the offset value falls below the threshold voltage, the trim adjustment value, level, or voltage is stored in the memory of the op-amp IC for further use during normal operation (e.g. when not operating in trim mode) of the op-amp.

Figure 3:
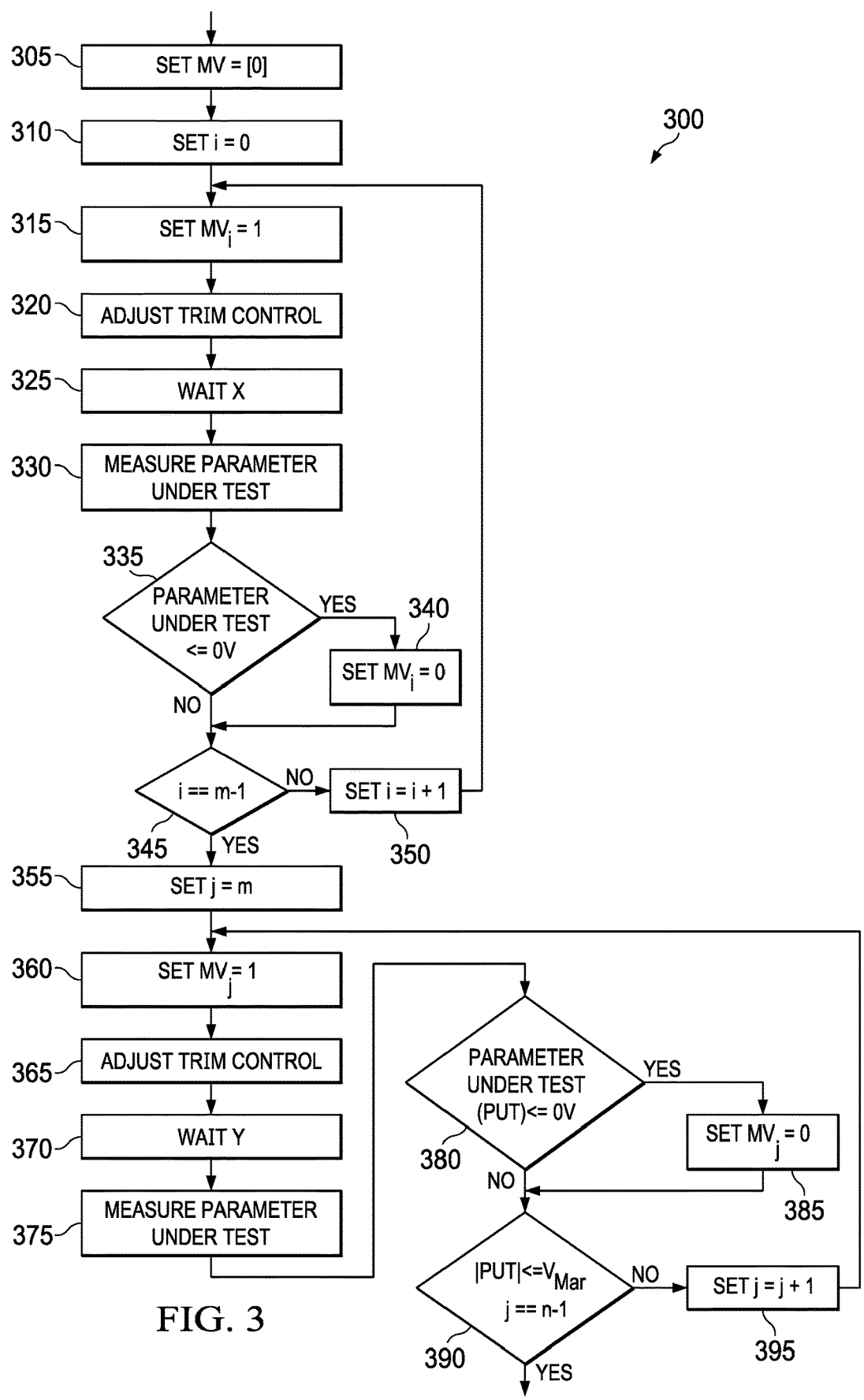
FIG. 3 illustrates a flow chart of a SAR logic implemented in the trim module.

FIG. 3 illustrates a flowchart of an example Successive Approximation Register Logic (SAR logic) 300. The exemplary SAR logic 300 can substitute, for example, steps 42 to 44 of FIG. 2.

Conversion time in a successive approximation register based ADC is a function of the speed of the comparator. If the comparator has to be slow (in this scenario, a decompensated op-amp), the speed suffers significantly, as the speed of a Successive Approximation Register (SAR) based data converter is a strong function of analog comparator speed. The following SAR logic is suggested as an alternative to dynamically increasing power consumption of the comparator. Increasing the power consumption usually affects other DC parameters of the comparator, which in the case of a self-trim amplifier defeats the purpose of using a SAR algorithm.

In an example, the SAR logic can comprise conducting a first number of iterations for determining coarse bits of the memory value at a first clock cycle duration and conducting a second number of iterations at a second clock cycle duration for determining remaining fine bits of the memory value MV.

At 305, the memory value MV can be cleared, if necessary. In other words, all register bits representing the memory value MV can be set to '0'/low. The memory value MV is a binary value having n bits. In the following, a MSB-0 numbering scheme is used, i.e. the bit of the memory value MV having the highest bit weight (most significant bit) is the leftmost bit having the index '0'.

At 310, index i can be set to zero, such that the first iteration of the SAR logic can determine the most significant bit MV[0] of the memory value MV. In total, a first number of m iterations comprising the steps 315 to 350 for determining m coarse bits (m most significant bits) will be conducted.

At 315, the indexed bit of the memory value MV[i] can be set to '1'/high. All other bits of the memory value MV can preserve (keep) their values.

At 320, the trim control can be adjusted. This can be done by controlling a digital-to-analog converter (DAC) via the memory value MV, such that the DAC translates the memory value to a trim control signal VSC for trimming the operational amplifier 54.

At 325, the SAR logic 300 can wait/sleep for a determined timespan X to let the outputs of the DAC and the operational amplifier 54 settle. In a digital implementation of the SAR logic, this step can comprise a sleep routine. An alternative implementation can comprise an appropriately chosen first clock cycle speed (at a first clock frequency) for the first number of iterations.

At 330, the parameter under test (e.g. the output VOUT of the op-amp 54) can be measured by the trimming module 56.

At 335, the trimming module 56 can check, if the parameter under test is larger or smaller than a predetermined (voltage) value. The predetermined voltage value can be 0 V.

If the parameter under test is smaller than the predetermined (voltage) value, the bit at the index position MV[i] can be (re-)set to '0'/low, at 340.

As long as an exit condition is not met at 345, index i can be increased by one at 350, to start a new iteration cycle at 315 in the following. The exit condition can be, for example, that a predetermined number of first iterations have been conducted to determine m coarse bits (most significant bits) of the memory value MV, wherein the predetermined number of first iterations can be larger than two, but smaller than the total number of bits of the memory value MV.

After the exit condition at 345 is met, a second number of iterations can be conducted at a second clock cycle duration for determining the remaining n-m fine bits (least significant bits) of the n bits of the memory value MV. The second number of iterations can comprise, for example, steps 360 to 395.

At 355, the second number of iterations can be initiated by setting index j to m.

At 360, the indexed bit of the memory value MV[j] can be set to '1'/high. All other bits of the memory value MV can remain their values.

At 365, the trim control can be adjusted. This can also be done by controlling the digital-to-analog converter (DAC) via the memory value MV, such that the DAC translates the memory value to a trim control signal VSC for trimming the operational amplifier 54. The transfer function of the DAC can be non-monotonic, as will be further described with regard to FIG. 4 to FIG. 7. In particular, the DAC can have a transfer function with an overlap in the bit weight of one or more least significant bits of the coarse bits and one or more most significant bits of the fine bits. This way, an overlap in respective search windows of the SAR logic provides an error correction capturing possible errors in the least significant bits of the coarse bits, resulting from (potential) incomplete settling during the first number of iterations.

At 370, the SAR logic 300 can wait/sleep for a predetermined timespan Y to let the outputs of the DAC and the operational amplifier 54 settle. The timespan Y can be longer than the waiting/sleep time X during the first number of iterations for determining the coarse bits of the memory value MV. In a digital implementation of the SAR logic, this step can comprise a sleep routine. An alternative implementation can comprise an appropriately chosen second clock cycle speed (at a second clock frequency) for the second number of iterations. The second clock frequency can be higher than the first clock frequency. It was shown that an appropriate ratio of Y to X can be, for example, between 2 and 10. In other words, the waiting/sleep time during the first number of iterations can be, for example, $\frac{1}{2}$ to $\frac{1}{10}^{th}$ of the waiting/sleep time during the second number of iterations. In a particular example, the clock cycle time during the first number of iterations can be 5 milliseconds, whereas the clock cycle time during the second number of iterations can be 20 milliseconds.

At 375, the parameter under test, e.g. the output VOUT of the op-amp 54, can be measured by the trimming module 56.

At 380, the trimming module 56 can check if the parameter is larger or smaller than a predetermined (voltage) value. For example, the predetermined voltage value can be 0 V.

If the output voltage VOUT is smaller than the predetermined voltage value, the bit at the index position MV[j] can be (re-)set to '0'/low, at 385.

As long as an exit condition is not met at 390, index j can be increased by one at 395, to start a new iteration cycle at 360 in the following. The exit condition can be, for example, that a predetermined number of second iterations have been conducted to fully determine the remaining n-m fine bits (least significant bits) of the memory value MV. The exit condition can also be met, if, for example, the measured parameter, e.g. the output voltage VOUT of the op-amp, lies within a predetermined (voltage) margin VMAR during trimming, for example if the output voltage VOUT is about 0 V.

Figure 4:
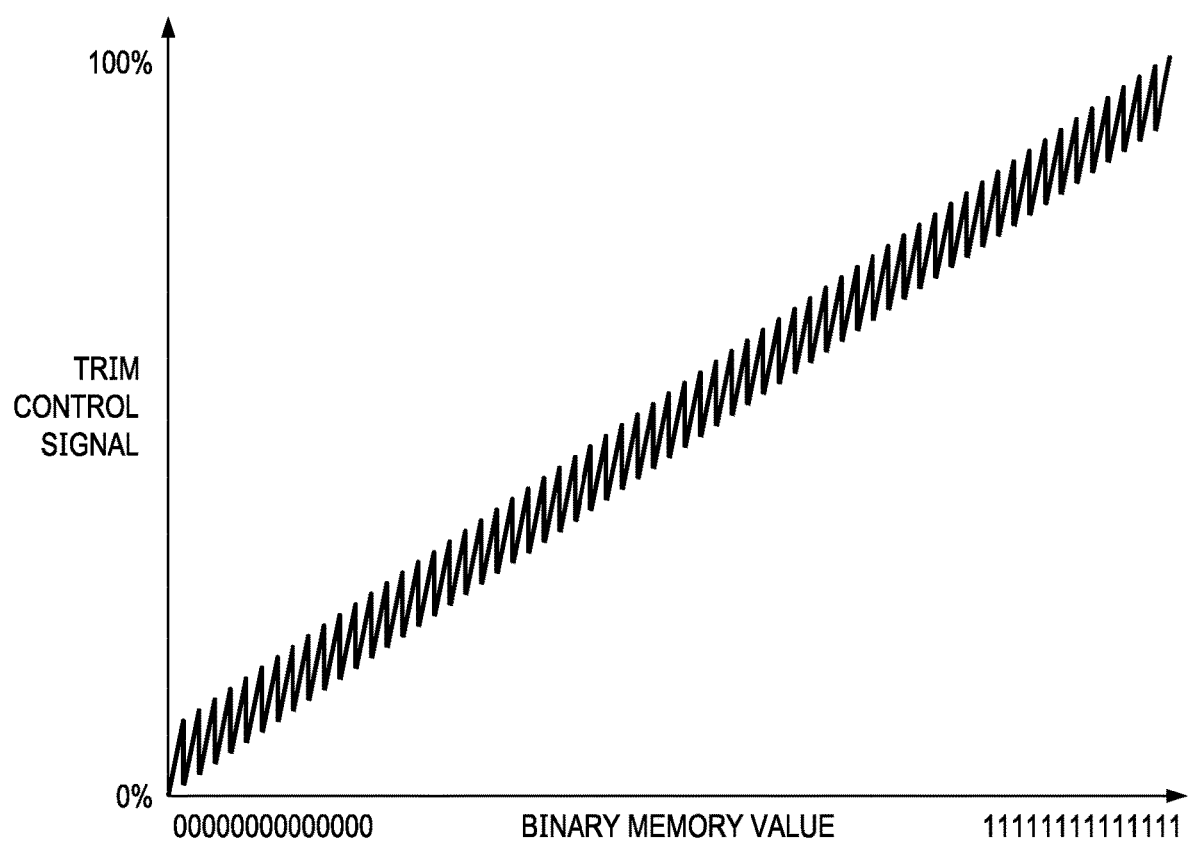
FIG. 4 illustrates a diagram showing a transfer function of a digital-to-analog converter of a trimming module.

FIG. 4 illustrates an exemplary transfer function of a DAC for a 14-bit memory value MV. The transfer function describes the relationship of input (memory value MV) and output (trim control signal VSC) of the DAC. The transfer function can include an overlap in bit weights of the least significant coarse bits (MV[4] and MV[5], as can be seen in the last column of TABLE 1 in FIG. 7) and the most significant fine bits (MV[6] and MV[7], see also TABLE 1). The transfer function can be substantially linear in sections. In particular, the transfer function can be described as being saw-tooth shaped.

In other words, the DAC can be configured to translate the coarse and fine bits of the memory value MV into respective analog values VSC via a predetermined mapping, in which a weight of at least one most significant bit of the fine bits MV[6], MV [7] is larger than a weight of at least one least significant bit of the coarse bits MV[4], MV[5], and to sum the respective analog values together to provide the control signal VSC.

Preferably, the SAR logic 300 is digitally implemented, to be portable to different processes and IC designs.

In an alternative example, the overlap in the search windows of the first number of iterations and the second number of iterations may be provided by re-determining one or more bits during the second number of iterations, which bits had already been determined during the first number of iterations. The transfer function of the DAV may then be linear/monotonic.

Using a binary weighted SAR logic for op-amp offset trimming requires waiting for the op-amp output to settle after changing the trim code. As can be seen in the diagrams in FIG. 5 and FIG. 6, using the same static time for all steps of the SAR logic, as shown by curves 510, 610, results in a long trim time of up to 300 mS. Variable wait-times for determining the most significant bits and the least significant bits, as shown by curves 520, 620 may significantly shorten the trim process. Using a short wait-time (of for example 5 mS) for trim code changes close to the MSB can be facilitated as big voltage steps lead to faster circuit reaction. Using a longer wait-time (of for example 20 mS) for trim code changes close to LSB improves accuracy, as small voltage steps require a longer settling time. To mitigate trim errors during the short wait-time (due to process variation), it is suggested to deviate the SAR logic 300 from a classical binary weighted code, by including an overlap in the respective search windows. As an example, the DAC can be distorted to have the bit weight of the most significant fine bits 540, 640 overlap the bit weight of the least significant bits coarse bits 530, 630 for error correction.

Figure 5:
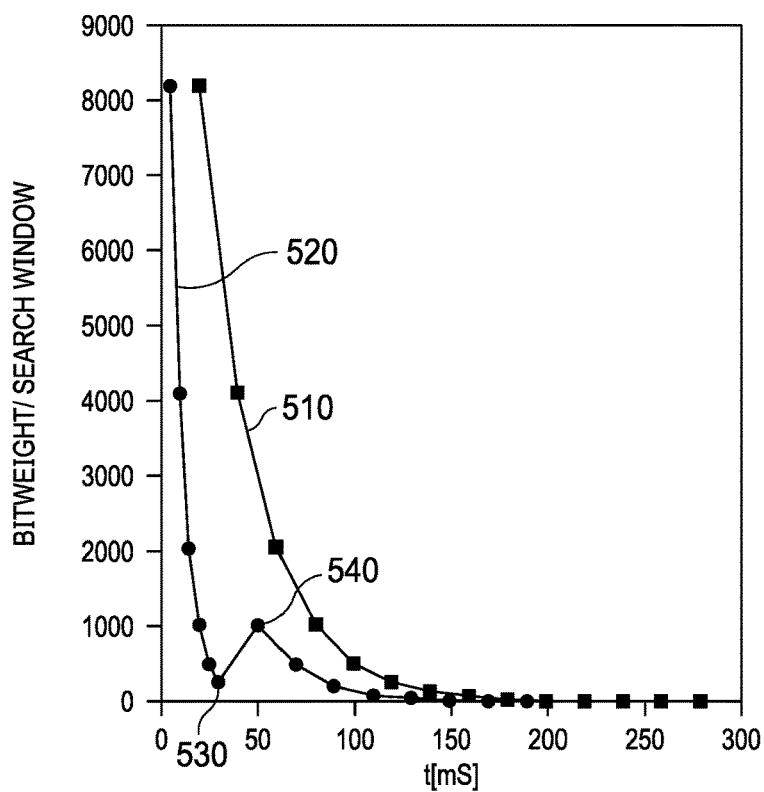
FIG. 5 illustrates a diagram depicting bit weights/search windows of a SAR logic over time.
Figure 6:
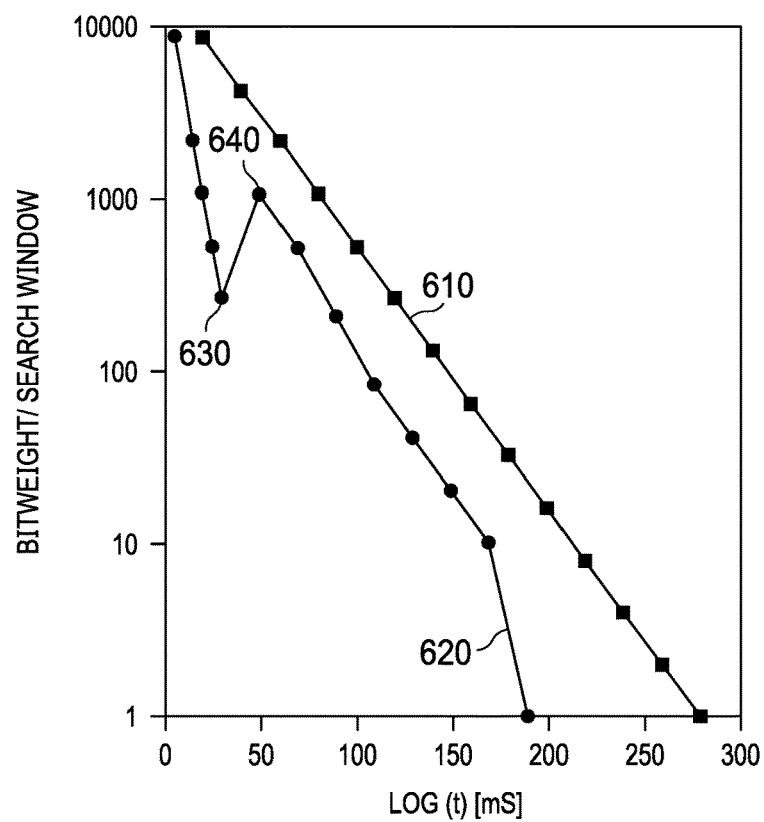
FIG. 6 illustrates a diagram depicting the bit weights/search windows of the SAR logic of FIG. 5 over a logarithmic time scale.

FIG. 7 shows a table comprising value pairs corresponding to the diagrams of FIG. 5 and FIG. 6.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" and "comprises" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

The invention claimed is:

1. A system comprising:
an operational amplifier (op-amp) with adjustable operational parameters, and a trimming module;
wherein the trimming module adjusts the operational parameters of the op-amp based on a memory value to compensate for an offset voltage of the op-amp;
wherein the trimming module comprises a successive approximation register (SAR) logic that controls the memory value, the SAR logic being configured to detect a given memory value that causes an output voltage of the op-amp to be within a predetermined voltage interval when applying a predetermined common mode voltage to inverting and non-inverting inputs of the op-amp; and
wherein the SAR logic comprises conducting a first number of iterations for determining coarse bits of the memory value and conducting a second number of iterations for determining remaining fine bits of the memory value, wherein the first number of iterations are conducted at a first clock cycle duration, and wherein the second number of iterations are conducted at a second clock cycle duration, the first clock cycle duration being shorter than the second clock cycle duration.

2. The system according to claim 1, wherein the trimming module comprises a digital-to-analog converter (DAC) converting the memory value to a control signal trimming the op-amp, wherein the transfer function of the DAC is non-monotonic.

3. The system according to claim 2, wherein the transfer function is substantially linear in sections.

4. The system according to claim 3, wherein the transfer function is substantially saw-tooth shaped.

5. The system according to claim 2, wherein the DAC is configured to translate the coarse and fine bits of the memory value into respective analog values via a predetermined mapping, in which a weight of at least one most significant bit of the fine bits is larger than a weight of at least one least significant bit of the coarse bits, and to sum the respective analog values together to provide the control signal.

6. The system according to claim 1, wherein the op-amp and the trimming module are mutually comprised by an integrated circuit chip.

7. A method comprising:
   detecting trigging of trim mode;
   applying, in a trim mode of an integrated circuit (IC) comprising an operational amplifier (op-amp), a given common mode voltage to inverting and non-inverting inputs of the op-amp,
   conducting, in a successive approximation register (SAR) logic of a trimming module connected to the op-amp, a first number of iterations determining coarse bits of a memory value, wherein the first number of iterations are conducted at a first clock cycle duration,
   conducting, in the SAR logic, a second number of iterations determining remaining fine bits of the memory value, wherein the second number of iterations are conducted at a second clock cycle duration, the second clock cycle duration being longer than the first clock cycle duration,
   adjusting, at the trimming module, after each iteration, a trim control signal that changes an operational parameter of the op-amp to trim the op-amp based on the memory value,
   measuring, at the trimming module, after each iteration, a parameter of the op-amp based on the adjusting, and
   detecting, at the trimming module, whether the measured parameter is within a predetermined interval.

8. The method of claim 7, further comprising
   converting, in a digital-to-analog converter (DAC) of the trimming module, the memory value to the trim control signal based on a non-monotonic transfer function.

9. The method of claim 8, wherein the transfer function is substantially linear in sections.

10. The method of claim 9, wherein the transfer function is substantially saw-tooth shaped.

11. The method of claim 8, comprising
    mapping, in the DAC, respective analog values to bits of the memory value, wherein a weight of at least one most significant bit of the fine bits is larger than a weight of at least one least significant bit of the coarse bits; and
    summing, in the DAC, the respective analog values together to provide the trim control signal.

12. The method of claim 7 wherein the trim mode is triggered on detection of a supply voltage at the op-amp higher than the supply voltage at the op-amp when the op-amp is operating as an op-amp.

13. The method of claim 7 wherein the trim mode is triggered on detection of a predetermined common mode voltage being applied between an inverting input and a non-inverting input of the op-amp.

14. The method of claim 7 wherein the trim mode is triggered on detection of a predetermined voltage being applied between an inverting input and a non-inverting input of the op-amp.

* * * * *